United States Patent [19]
Gilmer et al.

[11] Patent Number: 5,998,270
[45] Date of Patent: Dec. 7, 1999

[54] FORMATION OF OXYNITRIDE AND POLYSILICON LAYERS IN A SINGLE REACTION CHAMBER

[75] Inventors: Mark C. Gilmer, Austin; Mark I. Gardner, Cedar Creek, both of Tex.

[73] Assignee: Advanced Micro Devices, Sunnyvale, Calif.

[21] Appl. No.: 08/856,545

[22] Filed: May 15, 1997

[51] Int. Cl.$^6$ .................................................. H01L 21/336
[52] U.S. Cl. ......................... 438/287; 438/301; 438/761; 438/775; 438/786
[58] Field of Search ................................... 438/287, 761, 438/762, 786, 791, 907, 908, 913, 775, 301

[56] References Cited

U.S. PATENT DOCUMENTS

| | | |
|---|---|---|
| 5,352,636 | 10/1994 | Beinglass . |
| 5,397,720 | 3/1995 | Kwong et al. . |
| 5,407,870 | 4/1995 | Okada et al. . |
| 5,455,204 | 10/1995 | Dobuzinsky et al. . |
| 5,464,783 | 11/1995 | Kim et al. . |
| 5,527,718 | 6/1996 | Seita et al. . |
| 5,674,788 | 10/1997 | Wristers et al. . |
| 5,726,087 | 3/1998 | Tseng et al. . |

OTHER PUBLICATIONS

Ma, et al., "Suppression of boron Penetration in P+ Polysilicon Gate–P–MOSFET's Using Low–temperature Gate–Oxide N(2)O Anneal," IEEE Electron Device Letters, vol. 15, No. 3, pp. 109–111, Jun. 1994.

Vogel, et al., "Mobility Behavior of n–Channel and p–Channel MOSFET's with Oxynitride Gate Dielectrics Formed by Low–Pressure Rapid Thermal Chamical Vapor Deposition," IEEE Transactions on Electron Devices, vol. 43, No., 5, pp. 753–758, May 1996.

Hill, et al., "Low–Pressure Rapid Thermal Chemical Vapor Deposition of Oxynitride Gate Dielectrics for N–channel and P–channel MOSFET's," IEEE Transactions on Electron Devices, Vo. 43, No. 1, pp. 15–22, Jan. 1996.

Ghandhi, "VLSI Fabrication Principles, Silicon and Gallium Arsenide," pp. 484–485, 1994.

Chen et al "Study of Electrical Characteristics on Thermally Nitrided SiO2 (Nitroxide) Films," J. Electrochem. Soc. vol. 134 No. 4, pp. 875–877, 1984.

Ito et al "Direct thermal nitridation of siliocn dioxide films in anhydrous ammonia gas," J. Electrochem. Soc. vol. 127, No. 9, pp. 2053–2057, 1980.

Ito et al "Effect of thermally nitrided SiO2 (nitroxide) on MOS characteristics," vol. 129, No. 10, pp. 184–188, 1982.

*Primary Examiner*—John F. Niebling
*Assistant Examiner*—Jonathan Hack

[57] ABSTRACT

A semiconductor device fabrication process in which an oxynitride layer and a polysilicon layer are formed in the same reaction chamber is provided. In accordance with one embodiment of the invention, a semiconductor device is formed by forming, in a reaction chamber, an oxynitride layer on a surface of a substrate and forming, in the same reaction chamber, a polysilicon layer over the oxynitride layer. The oxynitride layer may be used to form a gate oxide and the polysilicon layer used to form a gate electrode.

30 Claims, 2 Drawing Sheets

FORMATION OF OXYNITRIDE AND POLYSILICON LAYERS IN A SINGLE REACTION CHAMBER

FIELD OF THE INVENTION

The present invention is directed generally to a method of manufacturing semiconductor devices and, more particularly, to formation of oxynitride and polysilicon layers of a semiconductor device in a single reaction chamber.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor. The MOS transistor is used as one of the basic building blocks of most modern electronic circuits.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily doped source/drain regions 105 are formed within the semiconductor substrate 101 and are connected to source/drain terminals (not shown). As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

One important step in the fabrication of semiconductor devices is the formation of the gate electrode and the insulating layer. Generally, this process involves first forming an insulating layer over the surface of a substrate and then forming a polysilicon layer over the insulating layer. The polysilicon and insulating layers are then typically etched to form the gate electrode and insulating layer structure depicted in FIG. 1.

It is often desirable to form an oxynitride insulating layer, e.g., an insulating layer which includes oxygen and nitrogen.

One conventional process for forming an oxynitride insulating layer involves oxidizing the substrate using pure oxygen in an atmospheric furnace and then reoxidizing the surface using $NH_3$ in a rapid thermal anneal (RTA) furnace to form an oxynitride layer. To form the polysilicon layer, the substrate is then typically moved to a chemical vapor deposition (CVD) chamber in which the polysilicon layer is deposited on the insulating layer using a CVD process.

In another conventional process for forming an oxynitride insulating layer, an oxynitride layer is formed on a substrate in an atmospheric furnace using $N_2O$ gas at 900° C. The substrate is then moved into another reaction chamber, such as a CVD chamber, where the polysilicon layer is deposited on the oxynitride layer.

In each of the above conventional processes, the formation of the oxynitride layer and the polysilicon layer undesirably involves processing at elevated temperatures and processing in multiple reaction chambers. This often requires that the substrate be transferred between one or more reaction chambers, typically causing a deleterious oxide growth on the substrate which degrades the quality of the oxynitride layer.

SUMMARY OF THE INVENTION

Generally, the present invention relates to a semiconductor device fabrication process in which an oxynitride layer and a polysilicon layer are formed in the same reaction chamber. In accordance with one embodiment of the invention, a semiconductor device is formed by forming, in a reaction chamber, an oxynitride layer on a surface of a substrate and forming, in the same reaction chamber, a polysilicon layer over the oxynitride layer. The oxynitride layer may be used to form a gate oxide and the polysilicon layer used to form a gate electrode.

The formation of the oxynitride layer may include reacting an oxygen bearing species with NOCl in the reaction chamber. The formation of the polysilicon layer may include the decomposition of silane ($SiH_4$) in the reaction chamber. In yet further embodiments, a fluorine bearing species may be added into the reaction chamber while polysilicon layer is being formed.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
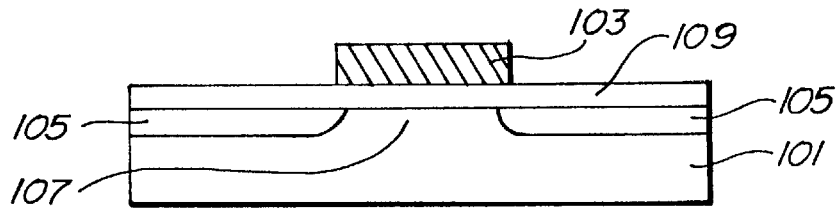
FIG. 1 illustrates elements of a typical MOS transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention generally provides a method of forming an oxynitride layer and polysilicon layer of a semiconductor device. The present invention is applicable to a number of semiconductor devices including in particular MOS transistors. While the present invention is not limited to such devices, an appreciation of various aspects of the invention will be gained through a discussion of various fabrication processes and device characteristics in connection with the examples provided below.

Figure 2:
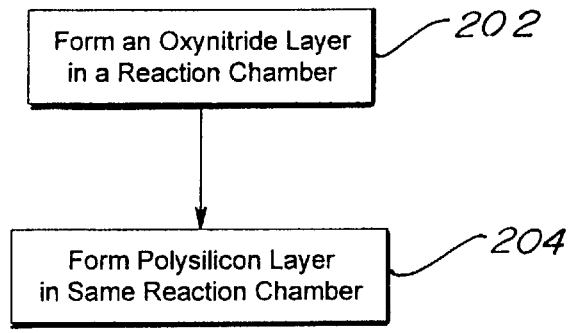
FIG. 2 is a flow diagram illustrating a fabrication process in accordance with an embodiment of the invention.

FIG. 2 is a flow diagram illustrating a fabrication process in accordance with one particular embodiment of the invention. As illustrated at Block 202, the fabrication process includes forming an oxynitride layer on a surface of a substrate using a reaction chamber. The term oxynitride layer is intended to broadly cover a layer of material that includes some amount of nitrogen and oxygen. The term reaction chamber, as used herein, is intended to broadly cover any type of structure, such as a chamber, furnace, or tube, that may be used for controlling a reaction. One suitable reaction chamber includes, for example, a low pressure chemical vapor deposition (LPCVD) reaction chamber. However, the invention is not so limited as a variety of reaction chambers would be suitable. A polysilicon layer is then formed over the oxynitride layer using the same reaction chamber, as illustrated at Block 204. The oxynitride layer may, for example, be used to form a gate oxide, and the polysilicon layer may, for example, be used to form a gate electrode.

Using the above-described process, a single reaction chamber can be used to form an oxynitride gate oxide layer as well as polysilicon gate electrode layer. Deleterious oxidation of the substrate resulting from movement of the substrate between reaction chambers is avoided. Accordingly, performance of the gate oxide layer and the ultimate device is improved.

The above process may generally be used in a number of manners to form oxynitride and polysilicon layers. Various implementations of the above process are described below with reference to FIGS. 3–5. The processes described below are provided by way of example only and are not intended to be limiting. Those skilled in the art will recognize the applicability of various modifications and equivalent processes.

Figure 3:
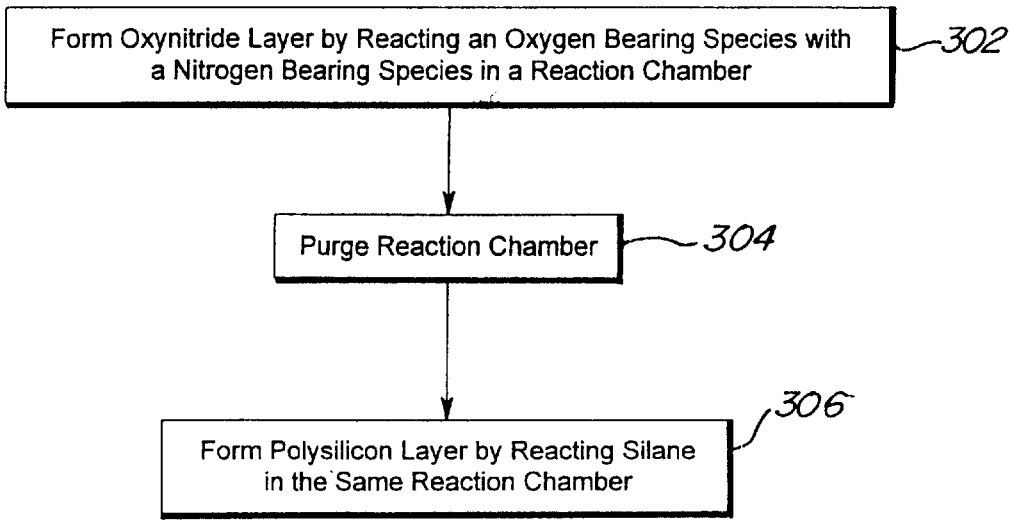
FIG. 3 is a flow diagram illustrating a fabrication process in accordance with another embodiment of the invention.

FIG. 3 is a flow diagram illustrating one exemplary process in accordance with an embodiment of the invention. As illustrated in Block 302, an oxynitride layer is formed on a surface of a substrate by reacting a nitrogen bearing species with an oxygen bearing species in a reaction chamber, such as an LPCVD reaction chamber.

In one particular embodiment, the oxynitride layer is formed by reacting one or more oxygen bearing species, such as $O_2$ or $O_3$, with nitrosyl chloride (NOCl). The concentrations and flow rates of the oxygen bearing species and the nitrosyl chloride as well as the reaction temperatures and pressures may be suitably selected in consideration of the desired reaction rate and the desired characteristics of the resultant oxynitride layer. The particular type of oxygen bearing species may also be selected in consideration of the desired reaction temperatures and pressures. For example, $O_3$ may be used to provide a lower reaction temperature than that provided by $O_2$.

Suitable reaction temperatures for many applications range from 600 to 950° C. Suitable reaction pressures for many applications include subatmospheric pressures, for example, 300 millitorr. However, the invention is not so limited. For example, reaction pressures at or above atmospheric pressure may also be used.

The oxygen bearing species may, for example, be provided undiluted and at flow rates around 1,000 standard cubic centimeters per minute (SCCM). Suitable concentrations for the nitrosyl chloride gas range, for example, from 1 to 10 percent by volume for many applications. Flow rates for the NOCl gas may, for example, be about 100 SCCM. It should be appreciated however that the invention is not limited to the particular concentrations and flow rates disclosed herein.

Dilution of the oxygen bearing species, the nitrosyl chloride, or the mixture of the NOCl and oxygen bearing species may be carried out using a carrier agent, such as $N_2$, $H_2$, Ar and the like. The amount of dilution may be selected in consideration of the reaction process. For example, the mixture of NOCl and the oxygen bearing species in the reaction chamber may be diluted with nitrogen down to 30% to slow the reaction. In this manner, an oxynitride layer may be grown to a thickness ranging from 20 to 40 angstroms, for example.

After formation of the oxynitride layer, the reaction chamber may be purged, as illustrated at Block 304. Purging of the reaction chamber generally includes cutting the supply of the nitrogen bearing species (e.g. NOCl) and the oxygen bearing species and flowing an inert gas, such as $N_2$, through the chamber.

After purging the reaction chamber, a polysilicon layer is formed in the reaction chamber, as illustrated at Block 306. In one embodiment, the polysilicon layer is formed by chemical vapor deposition of silane ($SiH_4$). The flow rate of the silane as well as the reaction chamber temperature and pressure may be suitably selected in consideration of the desired reaction. Suitable silane flow rates range from 100 to 300 SCCM for many applications. Subatmospheric pressures, of about 200 millitorr, for example, and temperatures ranging from about 400 to 700° C. would be suitable reaction pressures and temperatures for many applications. Using CVD of silane, a polysilicon layer having a thickness ranging from 1000 to 3000 Å may be formed, for example.

Following formation of the polysilicon layer, the reaction chamber may be purged, for example, with $N_2$, and backfilled, and the substrate removed for subsequent processing.

Figure 4:
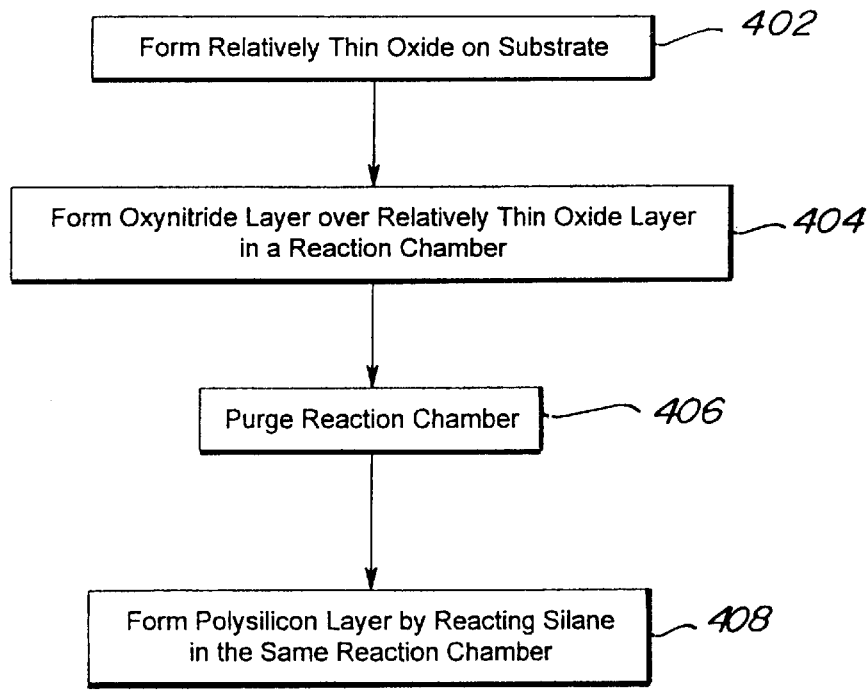
FIG. 4 is a flow diagram illustrating a fabrication process in accordance with still another embodiment of the invention.

FIG. 4 illustrates an exemplary process in accordance with yet another embodiment of the invention. As illustrated in Block 402, a relatively thin oxide layer is formed over a surface of a substrate. This oxide layer may, for example, be formed in a reaction chamber as will be discussed below, or another suitable oxygen bearing environment. The oxide layer may, for example, have a thickness of about 10 angstroms. An oxynitride layer is then formed over the thin oxide layer, as illustrated at Block 404. This may be done using a reaction chamber such as a LPCVD reaction chamber as discussed above.

In one embodiment, the relatively thin oxide layer and oxynitride layer are formed by first oxidizing the substrate in a reaction chamber filled with one or more oxygen bearing species, such as $O_2$ or $O_3$, to form a thin oxide layer of a desired thickness. The oxygen bearing species may, for example, be undiluted. A nitrogen bearing species such as NOCl, may then be introduced into the reaction chamber to react with the oxygen bearing species and form the oxynitride layer. This may be done in a manner as described above with respect to FIG. 3. For example, the oxygen bearing species may be provided at a 100 percent by volume concentration and the NOCl provided at about 1 to 10 percent by volume concentration with the reaction taking place at a temperature ranging from about 600 to 950° C. and a subatmospheric pressure.

After forming the oxynitride layer to a desired thickness, the reaction chamber may be purged and a polysilicon layer formed over the oxynitride layer using the reaction chamber, as illustrated at Blocks 406 and 408. Purging of the reaction chamber and formation of the polysilicon layer may be done in a similar manner as described above with respect to FIG. 3, Blocks 304 and 306. The reaction chamber may then be purged and backfilled and the silicon substrate removed for subsequent processing. The relatively thin oxide layer and oxynitride layer may together be used to form a gate oxide while the polysilicon layer may he used to form a gate electrode.

Using the above process, an oxynitride layer and a polysilicon layer may be formed in a single reaction chamber, thereby enhancing the performance characteristics of the oxynitride layer, as discussed above. In addition, by first forming a relatively thin oxide layer between the substrate and the oxynitride layer, the nitrogen in the oxynitride layer may be spaced from the surface of the substrate. This can provide advantages in certain device structures.

Figure 5:
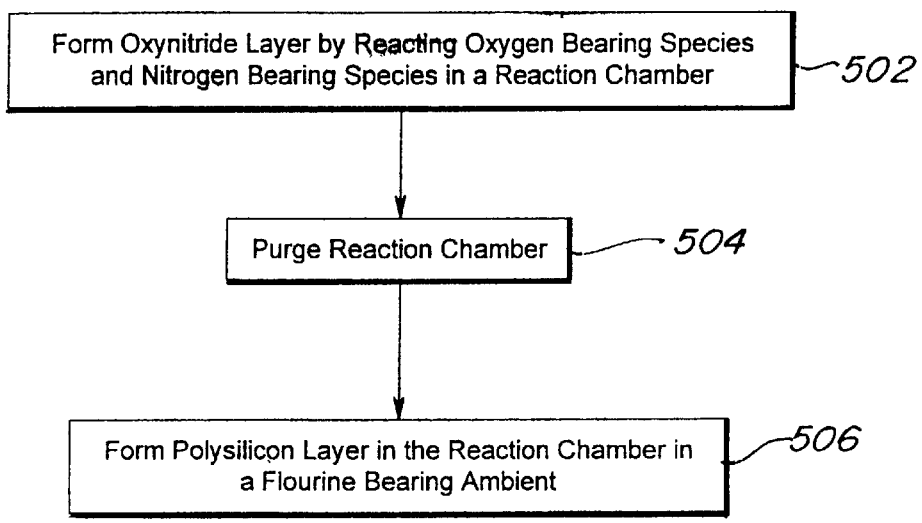
FIG. 5 is a flow diagram illustrating another fabrication process in accordance with yet another embodiment of the invention.

FIG. 5 is a flow diagram illustrating yet another exemplary process in accordance with another embodiment of the present invention. As illustrated at Block 502, an oxynitride layer is formed on a surface of a substrate using a reaction chamber. The oxynitride layer may be formed, for example, by reacting a nitrogen bearing species, such as NOCl, with an oxygen bearing species, such as $O_2$ and/or $O_3$, in a similar manner as discussed above with respect to FIGS. 3 or 4. Following formation of the oxynitride layer (or thin oxide layer and oxynitride layer), the reaction chamber may be purged, as indicated at Block 504, in a manner as discussed above.

A polysilicon layer is then formed in the reaction chamber in a fluorine bearing ambient to incorporate fluorine in the semiconductor device, as illustrated at Block 506. This step may involve flowing silane and a fluorine bearing species into the reaction chamber at a suitable temperature and pressure. Generally, the fluorine bearing species is incorporated into the polysilicon layer (and eventually migrates into the oxynitride layer) while the $SiH_4$ decomposes to form the polysilicon layer by chemical vapor deposition. The fluorine bearing species may be introduced when the $SiH_4$ begins flowing, or it may be introduced a period of time after the $SiH_4$ has been flowing.

The fluorine bearing species may, for example, be $SiF_4$, however, the invention is not so limited. The particular concentration of $SiF_4$ may be suitably selected in consideration of the desired fluorine properties of the resultant semiconductor device. Volumetric flow rates of $SiF_4$ ranging from 10 to 50 SCCM and $SiH_4$ ranging from 100 to 300 SCCM would be suitable for many applications. Suitable reaction temperatures range from about 400–700° C. at subatmospheric reaction pressures, for example, at 200 millitorr. The reaction chamber may then be purged and backfilled and the silicon substrate removed for subsequent processing.

Using the above process, an oxynitride layer and a polysilicon layer may be formed in the same reaction chamber. As discussed above, this prevents reoxidation on the substrate between reaction chambers and enhances device performance. In addition, the in-situ incorporation of fluorine in the polysilicon layer formation process also improves device performance. Generally, the fluorine defuses through the polysilicon layer and into the substrate-oxynitride layer interface. When the substrate-oxynitride layer interface is used to form a gate oxide-substrate interface, device performance can be improved by, for example, improving leakage current characteristics and reducing hot carrier degradation.

As noted above, the present invention provides a method of fabricating an oxynitride layer and a polysilicon layer of a semiconductor device. The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process of forming a semiconductor device, comprising:

forming, in a reaction chamber, an oxynitride layer on a surface of a substrate; and forming, in the reaction chamber, a polysilicon layer over the oxynitride layer;

wherein forming the oxynitride layer includes reacting an oxygen bearing species and a nitrogen bearing species in the reaction chamber, wherein the nitrogen bearing species includes NOCl.

2. The process of claim 1, further including purging the reaction chamber prior to forming the polysilicon layer.

3. The process of claim 2, wherein purging the reaction chamber includes providing nitrogen into the reaction chamber.

4. The process of claim 1, wherein the oxygen bearing species includes $O_2$.

5. The process of claim 1, wherein the oxygen bearing species includes $O_3$.

6. The process of claim 1, wherein the oxygen bearing species is diluted with nitrogen.

7. The process of claim 1, wherein the NOCl is provided in a ratio ranging from about 1 to 10% by volume.

8. The process of claim 7, wherein the ratio is about 3%.

9. The process of claim 1, wherein the oxynitride layer is formed at temperatures ranging from about 600 to 950° C.

10. The process of claim 1, wherein the oxynitride layer is formed at a subatmospheric pressure.

11. The process of claim 1, wherein the oxynitride layer is formed to a thickness ranging from about 10 to 40 angstroms.

12. The process of claim 1, wherein forming the oxynitride layer includes:

forming an oxide layer on the substrate; and forming an oxide layer bearing nitrogen on the oxide layer.

13. The process of claim 1, wherein forming the polysilicon layer includes providing $SiH_4$ into the reaction chamber and decomposing the $SiH_4$.

14. The process of claim 13, wherein forming the polysilicon layer further includes providing a fluorine bearing species into the reaction chamber while decomposing the $SiH_4$.

15. The process of claim 14, wherein the fluorine bearing species includes $SiF_4$.

16. The process of claim 1, wherein the polysilicon layer is formed at a temperature ranging from about 400 to 700° C.

17. The process of claim 1, wherein the polysilicon layer is formed at a subatmospheric pressure.

18. The process of claim 1, wherein the oxynitride layer comprises a gate oxide layer.

19. The process of claim 1, wherein the polysilicon layer comprises a gate electrode layer.

20. The process of claim 1, wherein the reaction chamber includes a Low-Pressure Chemical Vapor Deposition reaction chamber.

21. A process of forming a semiconductor device, comprising:

forming an oxynitride layer on a surface of a substrate by reacting an oxygen bearing species with NOCl in a reaction chamber; and forming a polysilicon layer on the oxynitride layer by decomposing $SiH_4$ in the reaction chamber.

22. The process of claim 20, further including introducing a fluorine bearing species into the reaction chamber while forming the polysilicon layer.

23. A process of forming a semiconductor device, comprising:

forming an oxide layer on a surface of a substrate;

forming an oxynitride layer on the oxide layer by reacting an oxygen bearing species with NOCl in a reaction chamber; and forming a polysilicon layer on the oxynitride layer by decomposing $SiH_4$ in the reaction chamber.

24. A process of forming a semiconductor device, comprising:

forming, in a reaction chamber, an oxynitride layer on a surface of a substrate; and forming, in the reaction chamber, a polysilicon layer over the oxynitride layer;

wherein forming the polysilicon layer includes providing SiH4 into the reaction chamber and decomposing the SiH4;

wherein forming the polysilicon layer further includes providing a fluorine bearing species into the reaction chamber while decomposing the SiH4.

25. The process of claim 24, wherein forming the oxynitride layer includes:

forming an oxide layer on the substrate; and forming an oxide layer bearing nitrogen on the oxide layer.

26. The process of claim 25, wherein forming the oxynitride layer includes reacting an oxygen bearing species and a nitrogen bearing species in the reaction chamber.

27. The process of claim 26, wherein the nitrogen bearing species includes NOCl.

28. The process of claim 27, wherein the NOCl is provided in a ratio ranging from about 1 to 10% by volume.

29. The process of claim 28, wherein the ratio is about 3%.

30. The process of claim 24, wherein the fluorine bearing species includes $SiF_4$.

* * * * *